(12) United States Patent
Lee (10) Patent No.: US 6,462,597 B2
(45) Date of Patent: *Oct. 8, 2002

(54) TRIP-POINT ADJUSTMENT AND DELAY CHAIN CIRCUITS

(75) Inventor: Andy L. Lee, San Jose, CA (US)

(73) Assignee: Altera Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,619

(22) Filed: Jan. 31, 2000

(65) Prior Publication Data

US 2002/0057121 A1 May 16, 2002

Related U.S. Application Data

(60) Provisional application No. 60/118,389, filed on Feb. 1, 1999.

(51) Int. Cl.[7] .................................................. H03H 11/26
(52) U.S. Cl. ........................ 327/261; 327/108; 327/112; 327/263; 326/85; 326/87
(58) Field of Search .................................. 327/205, 206, 327/68, 74, 261, 263, 264, 108, 112; 326/22, 23, 24, 85, 87

(56) References Cited

U.S. PATENT DOCUMENTS

| | | | | |
|---|---|---|---|---|
| 3,760,197 A | * | 9/1973 | Dann | 327/329 |
| 5,023,472 A | * | 6/1991 | Hashimoto et al. | 327/108 |
| 5,191,245 A | * | 3/1993 | Kang | 327/262 |
| 5,220,216 A | * | 6/1993 | Woo | 326/87 |
| 5,341,045 A | * | 8/1994 | Almulla | 327/112 |
| 5,668,488 A | * | 9/1997 | Sharpe-Geisler et al. | 327/108 |
| 5,760,620 A | * | 6/1998 | Doluca | 327/112 |
| 5,878,094 A | * | 3/1999 | Nowak et al. | 327/206 |
| 5,973,533 A | * | 10/1999 | Nagaoka | 327/264 |

* cited by examiner

Primary Examiner—Timothy P. Callahan
Assistant Examiner—An T. Luu
(74) Attorney, Agent, or Firm—Townsend and Townsend and Crew LLP (57) ABSTRACT

Circuit techniques provide different trip points for a rising-edge and for a falling-edge input to a logic gate. Adjustment of the gate trip point for a rising-edge input may be independently adjusted to that for the falling-edge input, and vice versa. Different circuit topologies are provided for delay chains on integrated circuits. Each implementation allows flexibility in delay elements through metal options to allow modifying delay chain delays with simple metal-only layout changes. Delay chains are used in integrated circuits to produce either a constant delay or to track another circuit delay.

60 Claims, 4 Drawing Sheets

TRIP-POINT ADJUSTMENT AND DELAY CHAIN CIRCUITS

This application claims the benefit of U.S. provisional application 60/118,389, filed Feb. 1, 1999, which is incorporated by references along with all the other references cited in this application.

BACKGROUND OF THE INVENTION

The present invention relates to the field of integrated circuit and more specifically to trip-point adjustment and delay circuits.

There are many types of integrated circuit including microprocessors, ASICs, memories, gate arrays, and programmable logic. On an integrated circuit, various circuitry is used to implement different functions. For example, for a digital integrated circuit, logic gates are the basic building blocks. Despite the overwhelming success of integrated circuits in the marketplace, there is a constant demand for integrated circuits that have better performance or have greater functionality. One of the ways to meet the demand for integrated circuits with greater performance is to improve the circuitry of the integrated circuit.

A standard CMOS logic gate has a gate trip point that defines the voltage at the gate input at which the output transitions. For a CMOS gate, this trip point is usually near the middle of the voltage range (i.e., VCC/2). By adjusting the ratio of the PMOS pull-up network W/L versus the NMOS pull-down network W/L in the CMOS gate, this trip point can be adjusted to be higher or lower than VCC/2. For a standard CMOS inverter, the gate trip point as adjusted in the above manner is the same for both rising and falling inputs. In some applications, it is desirable to have an inverter or logic gate with a different trip point for a rising-edge input from the trip point for a falling-edge input.

Another type of circuit that is useful in an integrated circuit is a delay circuit. Delay circuits are used in various places in an integrated circuit and for various purposes. Delay circuits can be used in conjunction with the clocking tree to ensure logic signals do not arrive too early at sequential logic, latches, and flip-flops, relative to the latching clock (i.e., prevent hold time violations). Delay circuits can be used in delay-locked loops and phase-locked loops. It is important to have circuits where the delay can be tuned to have the precise delay desired. Also, the delay circuit should have a delay that is relatively constant given variations in the process, temperature, and supply voltage.

Therefore, there is a need for trip point adjustment circuit and delay chain circuit techniques.

SUMMARY OF THE INVENTION

An aspect of the invention is a circuit technique that provides for different trip points for a rising-edge and for a falling-edge input to a logic gate. Adjustment of the gate trip point for a rising-edge input may be independently adjusted to that for the falling-edge input, and vice versa. This circuit may be useful in, for example, delay chain circuits and any logic where it is desirable to control independently the rising and falling delays. Another aspect of the invention is to provide different circuit topologies for delay chains on integrated circuits. Each implementation allows flexibility in delay elements through metal options to allow modifying delay chain delays with simple metal-only layout changes. Delay chains are used in integrated circuits to produce either a constant delay (e.g., to meet a minimum timing specification), or to track another circuit delay (e.g., hold time delays that track the clock network path delay).

In an embodiment, the invention is a logic circuit including a logic gate connected between a first input and an output of the logic circuit. A first group of transistors is connected in series between a first supply and the output, where a first transistor of the first plurality is connected to the first input and a second transistor of the first plurality is connected to a second input. A second group of transistors connected in series between a second supply and the output, where a third transistor of the second plurality is connected to the first input and a fourth transistor of the second plurality is connected to the second input.

In another embodiment, the invention is an integrated circuit including a first logic gate, a second logic gate, and first, second, third, fourth, fifth, sixth, seventh, and eighth resistances. A first conductor connects the first logic gate to the first resistance, a second conductor connects the first resistance to the second resistance, a third conductor connects the second resistance to the third resistance, a fourth conductor connects the third resistance to the fourth resistance, a fifth conductor connects the fourth resistance to the fifth resistance, a sixth conductor connects the fifth resistance to the sixth resistance, a seventh conductor connects the sixth resistance to the seventh resistance, and an eighth conductor connects the seventh resistance to the eighth resistance. A ninth conductor connects the second logic gate to the first conductor through a first metal option, second conductor through a second metal option, third conductor through a third metal option, fourth conductor through a fourth metal option, fifth conductor through a fifth metal option, sixth conductor through a sixth metal option, seventh conductor through a seventh metal option, and eighth conductor through an eighth metal option.

In yet another embodiment, the invention is an integrated circuit including first, second, third, and fourth logic gates. A first resistance is between the second logic gate and a first conductor, a second resistance is between a second conductor and the third logic gate, a third resistance is between the third logic gate and a third conductor, and a fourth resistance is between a fourth conductor and the fourth logic gate. A first metal option is between first and second conductors, and a second metal option between third and fourth conductors.

Other objects, features, and advantages of the present invention will become apparent upon consideration of the following detailed description and the accompanying drawings, in which like reference designations represent like features throughout the figures.

DETAILED DESCRIPTION

The present invention is a circuit that provides for a different trip point for a rising-edge and for a falling-edge input to a CMOS logic gate. Adjustment of the gate trip point for a rising-edge input may be independently adjusted to that for the falling-edge input, and vice versa. This circuit may be useful in, for example, delay chain circuits and any logic where it is desirable to control independently the rising and falling delays. The present invention is applicable to integrated circuit such as microprocessors, ASICs, memories, and programmable logic. Programmable logic integrated circuits are discussed in greater detail in the 1999 edition of *The Altera Data Book,* which is incorporated by reference.

Figure 1:
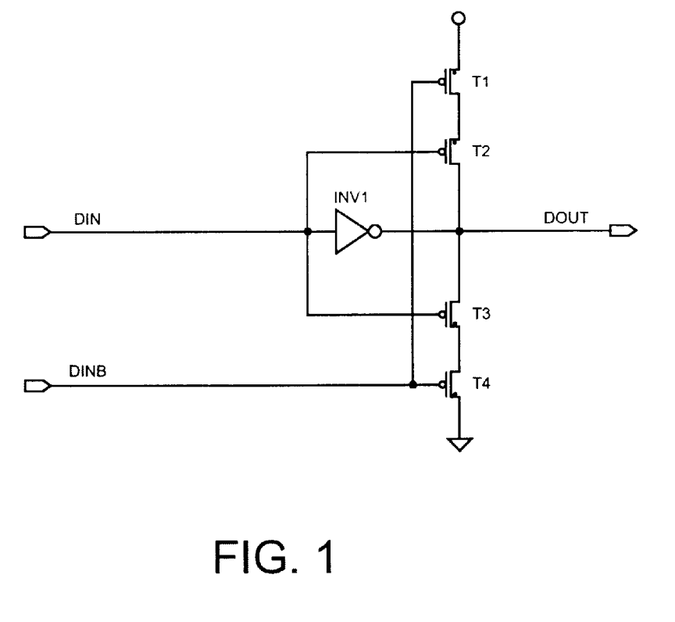
FIG. 1 shows a trip point adjustment circuit.

FIG. 1 shows the trip point adjustment circuit as applied to an inverter, which in this case is a CMOS inverter. A similar technique as shown may be similarly applicable to adjust the trip points of other types of logic gates including NAND, NOR, XOR, AND, OR, XNOR, and AND-OR-INVERT gates.

In addition to standard CMOS inverter INV1, the circuit in FIG. 1 further includes a series of pull-up stack transistors T1 and T2 and a series of pull-down stack of transistors T3 and T4. An inverter input DIN drives transistors T2 and T3. A signal DINB, an inverted form of the DIN signal, drives transistors T1 and T4. Transistors T1 and T2 are PMOS while transistors T3 and T4 and NMOS. For proper operation of the circuit, the transition of DINB should occur before the transition of signal DIN. This may be achieved through an inverter as shown in FIG. 2, which show one particular implementation.

Figure 2:
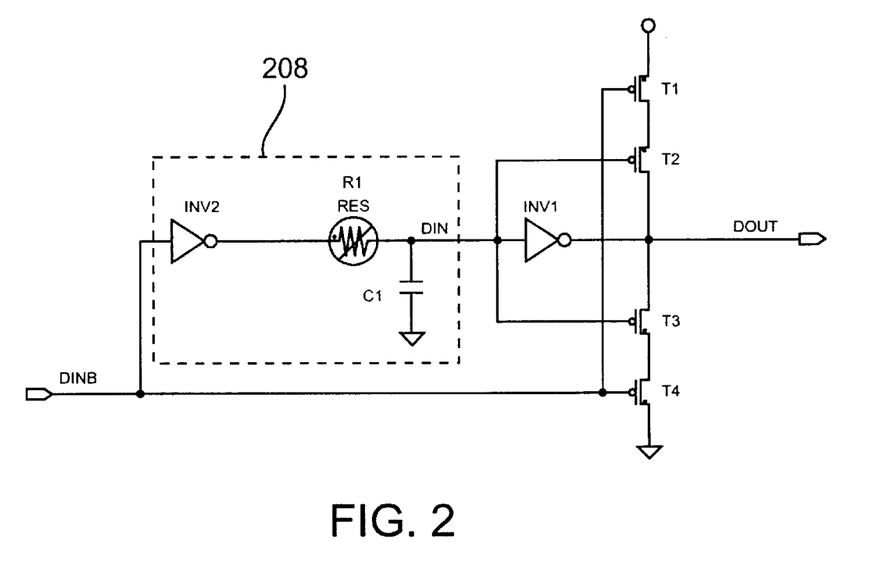
FIG. 2 shows a specific implementation of a trip point adjustment circuit.

In FIG. 2, DIN is delayed and inverted with respect to DINB by using a delay circuit 208. Circuit block 208 includes an inverter INV2 and a resistance R1 and capacitance C1, which give an RC delay. R1 may be a variable resistance to allow adjustment of the RC delay as desired. Other type of delay circuits such as an inverter delay chain may also be substituted for circuit block 208. The circuitry will operate with a delay of at least about one gate delay. So, a single inverter without the RC delay (as in FIG. 2) should operate properly. The delay can be any delay. For example the delay may be from about 0.1 nanoseconds to about 100 nanoseconds, or more.

In operation, because DINB transitions at or before the transition of DIN, either transistor T1 or T4 will be cutoff when the INV1 input transitions. This serves to disconnect either the pull-up network or pull-down network, respectively. So, for a rising edge signal at DIN, DINB will already be low and transistor T4 will be cutoff. Therefore, the pull-up network will be active while the pull-down network will not be active. The additional pull-up network to INV1 causes the trip point of the inverter to be higher.

Similarly, for a falling-edge signal at DIN, DINB will already be high and transistor T1 will be cutoff. Therefore, the pull-down network will be active while the pull-up network will not be active. The additional pull-down network to INV1 causes the trip point of the inverter to be lower.

In summary, for the configuration shown in FIG. 2, a rising edge at DIN will result in a higher trip point. And, a falling edge at DIN will result in a lower trip point. By sizing transistors T1 and T2 appropriately, the amount the trip point is adjusted for the rising DIN may be adjusted. Increasing the sizes of transistors T1 and T2 will raise the trip point while decrease their sizes will lower the trip point. By sizing transistors T3 and T4 appropriately, the amount that the trip point is adjusted for a falling DIN may be adjusted. Increasing the sizes of transistors T3 and T4 will lower the trip point while decreasing their sizes will raise the trip point For an alternative of the invention, a rising edge at DIN will result in a lower trip point and a falling edge at DIN will result in a higher trip point. This alternative embodiment may be obtained by placing an inverter between DINB and the gates of transistors T1 and T4.

This invention is useful in any case where a different trip point is desired for rising and falling edges into a logic gate. Examples of two applications are delay chains and circuits where equalized rising and falling edge delays are desired.

For delay chains, resistor/capacitance networks are often used in delay chains to produce a slow transition in a logic stage. For longer delays, a larger resistor or capacitor is required. By using the trip-point adjustment circuit as shown in FIG. 2, the trip point of the inverter may be adjusted to maximize the delay of the delay chain for a given resistor/capacitance size. The advantage of this is reduced area for a given delay. For a rising edge input at input DINB (which causes a falling edge at node DIN), the trip point of INV1 is LOWERED to extend the delay. For a falling edge input at input DINB (which causes a rising edge at node DIN), the trip point of INV1 is INCREASED to extend the delay. Regardless of rising or falling transition at DIN, the trip point of INV1 is adjusted to increase delay across the delay chain.

Another application is in circuits where equalized rising and falling delays are desirable. Since rising and falling trip points can be independently adjusted, this invention may be used to equalize rising and falling delays through a given logic path by including the trip-point adjustment circuitry in the path. If faster delays are desired, one can choose to use the alternate embodiment described above by placing an inverter between DINB and the gates of transistors T1 and T4.

Another aspect of the invention is to provide different circuit topologies for delay chains on integrated circuits. Each implementation allows flexibility in delay elements through metal options to allow modifying delay chain delays with simple metal-only layout changes. Delay chains are used in integrated circuits to produce either a constant delay (e.g., to meet a minimum timing specification), or to track another circuit delay (e.g., hold time delays that track the clock network path delay).

This invention describes three delay chain topologies. All these chain topologies may be implemented using unsalicided N+ poly over diffusion, but may be used with any type of resistor structure. In a representative process technology, unsalicided polysilicon has a sheet resistance of about 196 ohms per square. Unsalicided N+ polysilicon also has the characteristic of a negative temperature coefficient. This is a benefit in delay element circuits because this causes the resistance of the resistors to decrease as temperature increases. This counteracts the increase in the delay associated with transistors at higher temperatures. Also, with such a polysilicon resistor, when routed over diffusion, a distributed gate capacitance is built in, which gives a fairly constant RC delay.

Topology 1 (shown in FIG. 3) and topology 2 (shown in FIG. 4) are intended to be used for constant-delay delay chains. Topology 1 is intended for relatively constant delays up to about 2 nanoseconds in delay, taking into consideration current process technology. The delays will be relatively constant compared to transistor delay changes despite due variations in supply voltage and temperature. For delays longer than about 2 nanoseconds, topology 2 is more area-efficient. For these topologies, the sizing of transistors should be sufficiently strong such that the delay is dominated by the resistors. In other words, the impedance of the resistors should be greater than the impedances of the transistors.

Topology 3 (shown in FIG. 5) is intended for hold-time delay chains that are intended to track the corresponding clock network across all process and operating conditions. An example of an application of the delay chain in topology 3 is between the output of one register and the input of another register, where both registers are connected to the same clock network to prevent hold time violations between the two registers.

To conserve power, the three topologies incorporate an enable input (DEN) to allow the delay chain to be disabled when the delay chain is not in use. When DEN is a logic low, the delay chain will be disabled.

Figure 3:
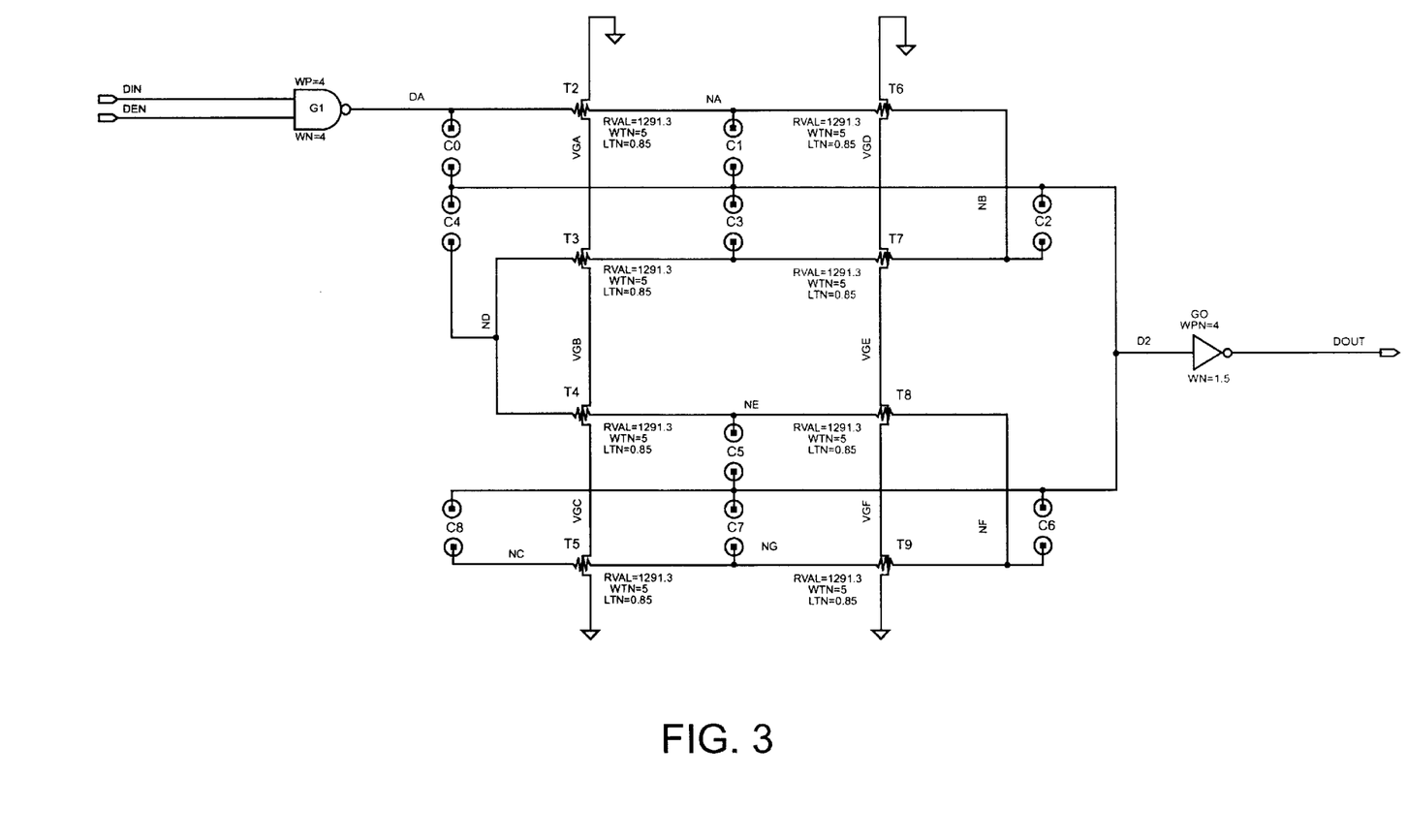
FIG. 3 shows a relatively constant delay circuit for short delays.

FIG. 3 shows a layout of eight equal-valued resistors T2 to T9 arranged serially with metal-1 (M1) contact points between them. By selectively varying the total impedance between a NAND gate G1 and an inverter G0, this will vary the delay of the circuitry. Specifically, a rising edge at DIN will be delayed and output at DOUT. The metal options C0 through C8 can be shorted together or left open as desired. By connecting one and only one of the nine metal options, the delay chain can allow nine different delays with a relatively simple M1-only change. Table 1 shows the resistance value between NAND gate G1 and inverter G0 when a particular contact point is shorted. For example, when C0 is shorted, the impedance will be 0. When C7 is shorted, the impedance will be 7x or 7 times whatever the resistance value is. In a specific embodiment of the circuit, each resistor has an impedance of about 1291 ohms.

TABLE 1

| Contact Point | Contact Point Impedance | Shorted Option |
|---|---|---|
| 0 | 0X | C0 |
| 1 | 1X | C1 |
| 2 | 2X | C2 |
| 3 | 3X | C3 |
| 4 | 4X | C4 |
| 5 | 5X | C5 |
| 6 | 6X | C6 |
| 7 | 7X | C7 |
| 8 | 8X | C8 |

FIG. 3 shows a single stage of a delay cell. As discussed earlier, the sizes of the transistors used to create NAND G1 and inverter G0 should be such that the impedance of the resistor network dominates. In other words, the transistors should be sufficient by strong in order to minimize their impedance relative to the impedances of the resistor network. The drive at the output of NAND G1 should be relatively strong. Inverter G0 can be a standard CMOS inverter. The trip point adjustment circuit of FIGS. 1 or 2 may be used for inverter G0 also. The trip point adjustment circuit will be more effective when the slope of the transition at its input is slower. However, the use of the trip point adjustment circuit in the circuit of FIG. 3 may not be as desirable as for the circuit of FIG. 4 because the delay of the circuit in FIG. 3 is shorter. The decision whether to use the trip point adjustment circuit for the circuit in FIG. 3 depends on factors including the space used by the circuitry and the amount of delay.

Figure 4:
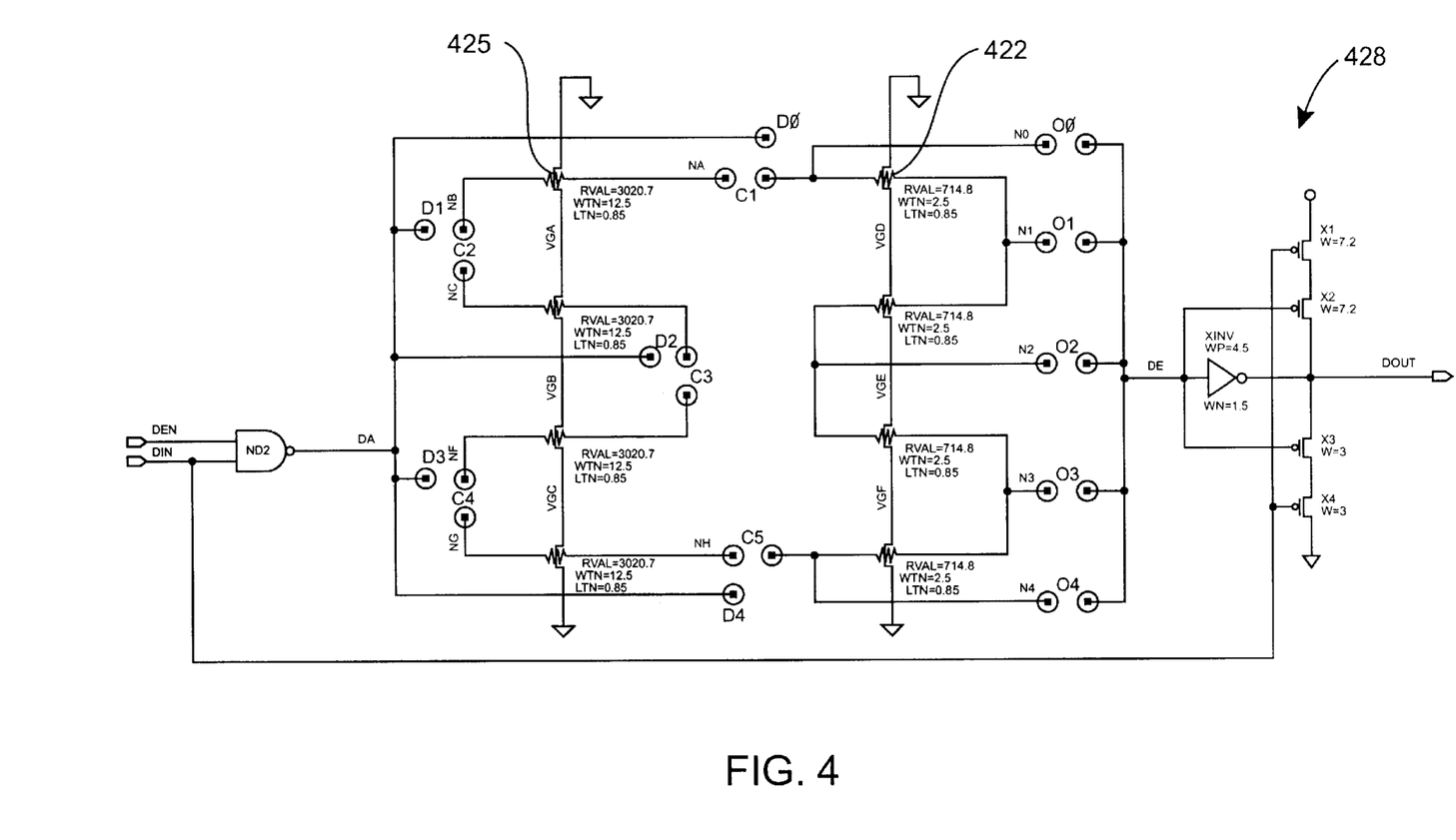
FIG. 4 shows a relatively constant delay circuit for longer delays.

FIG. 4 shows eight resistors arranged serially through M1-options C1 to C5. The driver of the resistor can vary where it drives the resistor chain through M1-options D1 to D5. The output driver of the delay chain can vary where it taps off the resistor chain through M1-options O1 to O4.

The right bank of four resistors 422 are each of a given size X. In the FIG. 4 implementation, this size is about 715 ohms. The left bank of resistors 425 are each of a size 5X. In the FIG. 4 implementation, this size is about 3021 ohms. The specific value of the resistors can have any value in order to implement the desired delay. By varying the M1 option connections for C1 to C5, D1 to D5, and O1 to O5, a resistance of length 24X is created where the output tap point can be tapped off of the resistor at any location from 0X to 24X. By varying the location of the tap point, twenty-five different delays can be achieved through M1 options changes only. Tables 2 and 3 summarize the resistance available depending on the options selected.

TABLE 2

| Contact Point | Contact Point Impedance | All C1 to C5 Shorted Except | All D0 to D4 Open Except | All O0 to O4 Open Except |
|---|---|---|---|---|
| 0 | 0X | C1 | D0 | O0 |
| 1 | 1X | C1 | D0 | O1 |
| 2 | 2X | C1 | D0 | O2 |
| 3 | 3X | C1 | D0 | O3 |
| 4 | 4X | C1 | D0 | O4 |
| 5 | 5X | C2 | D1 | O0 |
| 6 | 6X | C2 | D1 | O1 |
| 7 | 7X | C2 | D1 | O2 |
| 8 | 8X | C2 | D1 | O3 |
| 9 | 9X | C2 | D1 | O4 |
| 10 | 10X | C3 | D2 | O0 |
| 11 | 11X | C2 | D2 | O1 |

TABLE 3

| Contact Point | Contact Point Impedance | All C1 to C5 Shorted Except | All D0 to D4 Open Except | All O0 to O4 Open Except |
|---|---|---|---|---|
| 12 | 12X | C3 | D2 | O2 |
| 13 | 13X | C3 | D2 | O3 |
| 14 | 14X | C3 | D2 | O4 |
| 15 | 15X | C4 | D3 | O0 |
| 16 | 16X | C4 | D3 | O1 |
| 17 | 17X | C4 | D3 | O2 |
| 18 | 18X | C4 | D3 | O3 |
| 19 | 19X | C4 | D3 | O4 |
| 20 | 20X | C5 | D4 | O0 |
| 21 | 21X | C5 | D4 | O1 |
| 22 | 22X | C5 | D4 | O2 |
| 23 | 23X | C5 | D4 | O3 |
| 24 | 24X | C5 | D4 | O4 |

This implementation uses a trip-point adjustment circuit 428 to increase its delay. However, this embodiment of invention may be practiced without using the trip-point adjustment circuit. A standard CMOS inverter may be used instead. By using the trip-point adjustment circuit, this allows independent adjustment of the trip points to achieve larger delays for the same resistance network. In the circuit of FIG. 4, the resistances are expected to cause the transition at the input of inverter XINV to be relatively slow. Therefore, the trip-point adjustment should be very effective in increasing the delay.

Figure 5:
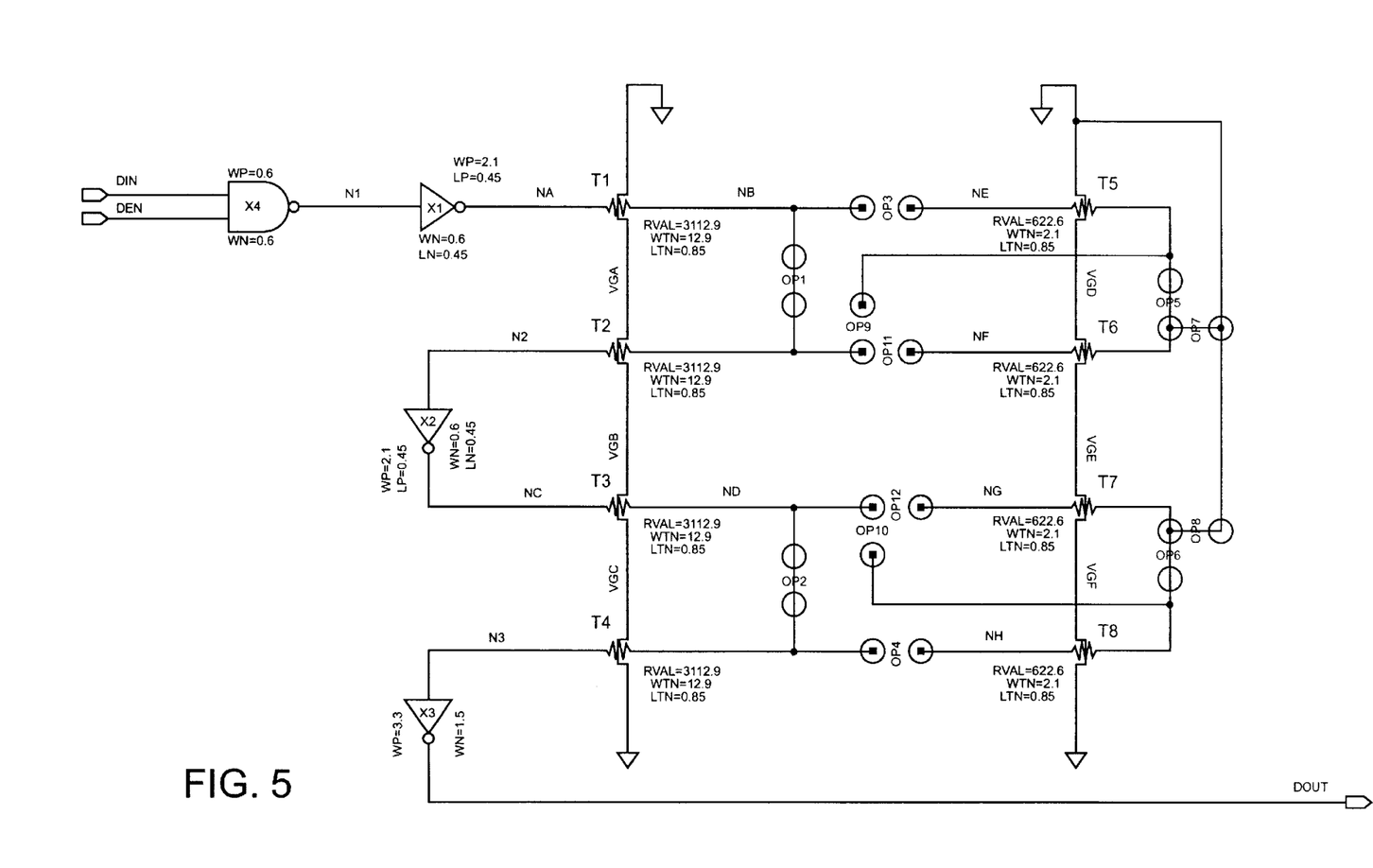
FIG. 5 shows a delay circuit for tracking a clock network.

The topology in FIG. 5 is intended for hold-time delay chains that are designed to have a delay that tracks a corresponding clock network delay across all process and operating conditions.

To allow this tracking, nonminimum channel length drivers X1 and X2 are used to drive the resistor network, which is composed of resistors T1 to T4. Nonminimum channel length transistors will vary more with condition changes than a clock path using minimum channel length devices; resistances for T1 to T5 will vary much less with conditions than the clock path composed of minimum channel length devices. Therefore, balance of nonminimum channel length sizing versus resistor sizing will produce a corresponding delay that will track with the associated clock network. For example, if the minimum drawn channel length permitted by the process is 0.25 microns, then the drawn channel lengths of the inverters X1 and X2 could be 0.45 microns.

To balance out differences in rising and falling delays, a two-stage delay chain is used. This is used because process skew conditions can produce very different delays for either a rising-edge or falling-edge input in a single-stage delay as in topologies 1 and 2. The right bank of resistors (T5 to T8) is added to allow increasing resistor length through M1 options changes only. Resistors T1 to T4 are each 5× larger than T4 to T8. In FIG. 5, resistors T1 to T4 are about 3113 ohms each and resistors T5 to T8 are about 623 ohms each. The resistors can have any desired resistance to give the amount of desired delay.

Table 4 shows three different options for configuring the FIG. 5 circuitry. The table gives the option information for only a single stage of the circuit. FIG. 5 has two resistor stages. The circuit in FIG. 5 has two resistors stages which help balance out the rising and falling transitions. There are an even number of inversions in the delay chain. In the table, X is about 3113 ohms and Y is about 623 ohms. There are eight resistors total in a single stage. Four resistors are of X resistance and four resistors are of Y resistance. Options OP7 and OP8 are used to tie unused resistors to VSS.

TABLE 4

| Option | Connected Options (All Others Unconnected) | Resistance Value for Each of Two Stages |
|---|---|---|
| A | OP1, OP2, OP5, OP7, OP6, OP8 | 2X (6225.8 Ohms) |
| B | OP3, OP9, OP7, OP10, OP4, OP8 | 2X + Y (6848.4 Ohms) |
| C | OP3, OP5, OP11, OP12, OP6, OP4 | 2X + 2Y (7471 Ohms) |

This detailed description of the invention has been presented for the purpose of illustration and description. It is not intended to be exhaustive or to limit the invention to the precise form described. Many modifications and variations are possible in light of this detailed description. The embodiments were chosen and described in order to best explain the principles of the invention and its practical applications. Others skilled in the art will recognize that various modifications can be made in order to best utilize and practice the invention for a particular application. The scope of the invention is defined by the following claims.

What is claimed is:

1. A logic circuit comprising:
a logic gate coupled between a first input and an output of the logic circuit;
a first plurality of transistors coupled in series between a first supply and the output, wherein a first plurality of transistors comprises a first transistor coupled to the first input and a second transistor coupled to a second input; and
a second plurality of transistors coupled in series between a second supply and the output, wherein the second plurality of transistors comprises a third transistor coupled to the first input and a fourth coupled to the second input, wherein the logic circuit has a first trip point for a rising edge at the first input and a second trip point for a falling edge at the first input, and the first trip point is above the second trip point.

2. The logic circuit of claim 1 wherein the first and second transistors are PMOS transistors and the third and fourth transistors are NMOS transistors.

3. The logic circuit of claim 1 wherein the first supply is VCC and the second supply is VSS.

4. The logic circuit of claim 1 wherein the logic gate is an inverter.

5. The logic circuit of claim 1 wherein a signal at the first input is delayed and inverted with respect to a signal at the second input.

6. The logic circuit of claim 5 further comprising:
an inverter coupled between the second input and a first node;
a resistance coupled between the first node and the first input; and a capacitance coupled between the first input and the second supply.

7. The logic circuit of claim 6 wherein the resistance is variable.

8. The logic circuit of claim 1 wherein the logic gate is a CMOS inverter.

9. The logic circuit of claim 1 wherein a rising edge at the second input is followed by a falling edge at the first input with a delay between the rising and falling edges.

10. The logic circuit of claim 1 wherein a falling edge at the second input is followed by a rising edge at the first input with a delay between the falling and rising edges.

11. The logic circuit of claim 9 wherein the delay is at least about one gate delay.

12. The logic circuit of claim 9 wherein the delay is from about 0.1 nanoseconds to about 100 nanoseconds.

13. The logic circuit of claim 1 further comprising:
an inverter having an input coupled to the second input and an output coupled to gates of the second transistor and the fourth transistor.

14. The logic circuit of claim 1 wherein the logic circuit has a plurality of trip points.

15. The logic circuit of claim 1 wherein the first trip point is adjusted by varying sizes of the first pluarlity of transistors.

16. The logic circuit of claim 1 wherein the second trip point is adjusted by varying sizes of the second plurality of transistors.

17. An integrated circuit comprising:
first, second, third, and fourth logic gates formed on a substrate of the integrated circuit, wherein the first logic gate is coupled to the second logic gate;
a first resistance coupled between the second logic gate and a first conductor, a second resistance coupled between a second conductor the thrid logic gate, a third resistance coupled between the third logic gate and a third conductor, and a fourth resistance coupled between a fourth conductor and the fourth logic gate; and
a first metal option between first and second conductors, and a second metal option between third and fourth conductors.

18. The integrated circuit of claim 17 wherein the second and third logic gates have nonminimum channel lengths.

19. The integrated circuit of claim 17 wherein the resistances are formed using unsalicided polysilicon.

20. The integrated circuit of claim 17 wherein the channel lengths of the second and third logic gates are 0.45 microns or greater.

21. The integrated circuit of claim 17 wherein the first logic gate is a NAND gate.

22. A logic circuit comprising:
a logic gate coupled between a first input and an output of the logic circuit;
a first plurality of transistors coupled in series between a frist supply and the output, wherein the first plurality of transistors comprises a first transistor coupled to the first input and a second transistor coupled to a second input;
a second plurality of transistors coupled in series between a second supply and the output, wherein the second plurality of transistors comprises a third transistor coupled to the first input and a fourth transistor coupled to the second input; and an inverter having an input coupled to the second input and an output coupled to the first input.

23. The integrated circuit of claim 22 wherein the first and second transistors are PMOS transistors and the third and fourth transistors are NMOS transistors.

24. The logic circuit of claim 22 wherein the first supply is VCC and the second suppply is VSS.

25. The logic circuit of claim 22 wherein the logic gate is an inverter.

26. The logic circuit of claim 22 wherein a signal at the first input is delayed and inverted with respect to a signal at the second input.

27. The logic circuit of claim 22 further comprising a variable resistance coupled between the output of the inverter and gates of the first and third transistors.

28. The logic circuit of claim 22 wherein the logic gate is a CMOS inverter.

29. The logic of claim 22 wherein a rising edge at the second input is followed by a falling edge at the first input with a delay between the rising and falling edges.

30. The logic circuit of claim 22 wherein a falling edge at the second input is followed by a rising edge at the first input with a delay between the falling and rising edges.

31. The logic circuit of caim 29 wherein the delay is from about 0.1 nanoseconds to about 100 nanoseconds.

32. The logic circuit of claim 29 whrein the logic ciruit has a plurality of trip points.

33. The logic circuit of claim 29 wherein the logic circuit has a first trip point for a rising edge at the first input and a second trip point for a falling edge at the first input.

34. The logic circuit of claim 33 wherein the first trip point is above the second trip point.

35. The logic circuit of claim 29 wherein the logic circuit has a first trip point for a rising edge at the first input and a second trip point for a falling edge at the first input, and the second trip point is above the first trip point.

36. The logic circuit of claim 29 wherein the first trip point is adjusted by varying sizes of the first plurality of transistors.

37. The logic circuit of claim 29 wherein the second trip point is adjusted by varying sizes of the second plurality of transistors.

38. A logic circuit comprising:
a logic gate coupled between a first input and an output of the logic circuit;
a first plurality of transistors coupled in series between a first supply and the output, wherein the first plurality of transistors comprises a first transistor coupled to the first input and a second transistor coupled to a second input;
a second plurality of transistors coupled in series between a second supply and the output, wherein the second plurality of transistors comprises a third transistor coupled to the first input and a fourth transistor coupled to the second input;
an inverter coupled between the second input and a first node;
a resistance coupled between the first node and the first input; and
a capacitance coupled between the first input and the second supply.

39. The logic circuit of claim 38 wherein the resistance is variable.

40. The logic circuit of claim 38 wherein a rising edge at the second input is followed by a falling edge at the first input with a delay between the rising and falling edges.

41. The logic circuit of claim 38 wherein a falling edge at the second input is followed by a rising edge at the first input with a delay between the falling and rising edges.

42. The logic circuit of claim 40 wherein the delay is at least about one gate delay.

43. The logic circuit of claim 40 wherein the delay is from about 0.1 nanoseconds to about 100 nanoseconds.

44. The logic circuit of claim 40 wherein the logic circuit has a plurality of trip points.

45. The logic circuit of claim 40 wherein the logic circuit has a first trip point for a rising edge at the first input and a second trip point for a falling edge at the first input.

46. The logic circuit of claim 45 wherein the first trip point is above the second trip point.

47. The logic circuit of claim 40 wherein the logic circuit has a first trip point for a rising edge at the first input and a second trip point for a falling edge at the first input, and the second trip point is above the first trip point.

48. The logic circuit of claim 38 wherein the first trip point is adjusted by varying sizes of the first plurality of transistors.

49. The logic circuit of claim 38 wherein the second trip point is adjusted by varying sizes of the second plurality of transistors.

50. A logic circuit comprising:
a logic gate coupled between a first input and an output of the logic ciruit;
a first plurality of transistors coupled in series between a first supply and the output, wherein the first plurality of transistors comprises a first transistor coupled to the first input and a second transistor coupled to a second input;
a second plurality of transistors coupled in series between a second supply and the output, wherein the second plurality of transistors comprises a third transistor coupled to the first input and a fourth transistor coupled to the second input; and
an inverter having an input coupled to the second input and an output coupled to gates of the first transistor and the third transistor, wherein a rising edge at the second input is followed by a falling edge at the first input with a delay between the rising and falling edges, and the delay is at least about one gate delay.

51. A logic circuit comprising:
a logic gate coupled between a first input and an output of the logic ciruit;
a first plurality of transistors coupled in series between a first supply and the output, wherein the first plurality of transistors comprises a first transistor coupled to the first input and a second transistor coupled to a second input;
a second plurality of transistors coupled in series between a second supply and the output, wherein the second plurality of transistors comprises a third transistor coupled to the first input and a fourth transistor coupled to the second input; and
an inverter having an input coupled to the second input and an output coupled to gates of the first transistor and the third transistor, wherein a signal at the first input is delayed and inverted with respect to a signal at the second input.

52. A logic circuit comprising:
a logic gate coupled between a first input and an output of the logic circuit;
a first plurality of transistors coupled in series between a first supply and the output, wherein the first plurality of transistors comprises a first transistor coupled to the first input and a second transistor coupled to a second input;

a second plurality of transistors coupled in series between a second supply and the output, wherein the second plurality of transistors comprises a third transistor coupled to the first input and a fourth transistor coupled to the second input; and an inverter having an input coupled to the second input and an output coupled to gates of the first transistor and the third transistor, wherein a rising edge at the second input is followed by a falling edge at the first input with a delay between the rising and falling edges.

53. A logic circuit comprising:

a logic gate coupled between a first input and an output of the logic circuit;

a first plurality of transistors coupled in series between a first supply and the output, wherein the first plurality of transistors comprises a first transistor coupled to the first input and a second transistor coupled to a second input;

a second plurality of transistors coupled in series between a second supply and the output, wherein the second plurality of transistors comprises a third transistor coupled to the first input and a fourth transistor coupled to the second input; and an inverter having an input coupled to the second input and an output coupled to gates of the first transistor and the third transistor, wherein a falling edge at the second input is followed by a rising edge at the first input with a delay between the falling and rising edges.

54. The logic circuit of claim 52 wherein the delay is from about 0.1 nanoseconds to about 100 nanoseconds.

55. The logic circuit of claim 52 wherein the logic circuit has a plurality of trip points.

56. The logic circuit of claim 52 wherein the logic circuit has a first trip point for a rising edge at the first input and a second trip point for a falling edge at the first input.

57. The logic circuit of claim 56 wherein the first trip point is above the second trip point.

58. The logic circuit of claim 52 wherein the logic circuit has a first trip point for a rising edge at the first input and a second trip point for a falling edge at the first input, and the second trip point is above the first trip point.

59. The logic circuit of claim 52 wherein the first trip point is adjusted by varying sizes of the first plurality of transistors.

60. The logic circuit of claim 52 wherein the second trip point is adjusted by varying sizes of the second plurality of transistors.

* * * * *